(12) United States Patent
Erion et al.

(10) Patent No.: US 6,561,679 B1
(45) Date of Patent: May 13, 2003

(54) DECORATIVE COATING FOR EXTERIOR AUTOMOTIVE LIGHTING APPLICATIONS

(75) Inventors: Jeffrey Allen Erion, Plymouth, MI (US); Jill Elizabeth Curtindale, Northville, MI (US); Diane Lynne Wolfe, Sandusky, OH (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/716,499

(22) Filed: Nov. 20, 2000

(51) Int. Cl.[7] ................................................. F21V 9/00
(52) U.S. Cl. ...................... 362/293; 362/516; 362/546; 362/549
(58) Field of Search ................................. 362/516, 509, 362/546, 293, 549; 427/548

(56) References Cited

U.S. PATENT DOCUMENTS

| | | | |
|---|---|---|---|
| 4,364,637 A | * | 12/1982 | Ohno et al. ................... 350/288 |
| 5,010,458 A | | 4/1991 | Fraizer |
| 5,045,344 A | | 9/1991 | Pinkhasov ..................... 427/37 |
| 5,143,445 A | | 9/1992 | Bateman et al. |
| 5,548,491 A | | 8/1996 | Karpen |
| 6,000,814 A | * | 12/1999 | Nestell et al. ............... 362/267 |
| 6,277,499 B1 | * | 8/2001 | Beers ........................... 428/548 |

FOREIGN PATENT DOCUMENTS

| | | |
|---|---|---|
| GB | 491223 | 8/1938 |
| GB | EP0860652 | 2/1998 |
| JP | GB2112301 | 7/1983 |
| JP | 100269801 | 9/1997 |
| JP | EP0947763 | 10/1999 |

\* cited by examiner

Primary Examiner—Sandra O'Shea
Assistant Examiner—Guiyoung Lee
(74) Attorney, Agent, or Firm—MacMillan, Sobanski & Todd, LLC

(57) ABSTRACT

An automobile light having a decorative coating having a reflector and a bezel connected to the reflector. The decorative coating is applied to one or both of the reflector or the bezel. The decorative coating includes a decorative layer that has a golden appearance.

16 Claims, 2 Drawing Sheets

DECORATIVE COATING FOR EXTERIOR AUTOMOTIVE LIGHTING APPLICATIONS

TECHNICAL FIELD

This invention relates to an improved coating for use in exterior automobile uses. More specifically, the invention relates to an improved decorative and reflective coating for use with automotive lighting applications.

BACKGROUND OF THE INVENTION

Physical vapor deposition is one technique used to fix metallic compounds to a wide variety of substrates, such as automobile parts. Physical vapor deposition can be practiced by a wide variety of techniques, such as thermal evaporation or sputtering, chemical vapor deposition, ion plating, electroplating, plasma spraying, and the like. The sputtering process can be done by direct current (D.C.) sputtering, alternating current (A.C.) sputtering, radio frequency sputtering, or magnetron sputtering deposition or other suitable techniques. As known, a sputtering process is performed in a high vacuum system equipped with a target assembly and platens for holding the substrate, a tungsten tile in this invention, and preferably employs a magnetron. An inert gas, such as argon, helium, neon, krypton, or xenon, is introduced into a conventional sputtering system in the 1–10 mTorr range to provide the proper operating pressure.

It is known to provide an automobile light with a reflector. The reflector may be produced by fixing a thin layer of a metallic compound to a substrate. Metallic compounds can also be fixed to exterior surfaces of the automobile. For example, trim and other types of decorative features may employ one or more thin layers of the metallic compound to enhance the aesthetic appeal of the automobile. Current techniques for applying the thin layers of the metallic compound can produce decorative coatings which are uneven and lead to undesirable appearances. Likewise, current decorative coatings are limited in the range of colors or tints available to increasingly sophisticated consumers. When applied to automobile lights, the uneven coatings and limited tint selection may be particularly aesthetically unpleasing. It would thus be desirable to produce an improved coating for use in automobile light applications.

SUMMARY OF THE INVENTION

The above objects as well as other objects not specifically enumerated are achieved by an automobile light having a decorative coating having a reflector and a bezel connected to the reflector. The decorative coating is applied to one or both of the reflector or the bezel. The decorative coating includes a decorative layer that has a golden appearance.

According to this invention there is also provided an automobile light having a decorative coating having a reflector and a bezel connected to the reflector. The decorative coating is applied to one or both of the reflector or the bezel. The decorative coating includes a decorative layer that is a magnetron sputtered decorative layer having copper in an amount of about 90 percent.

Various objects and advantages of this invention will become apparent to those skilled in the art from the following detailed description of the preferred embodiment, when read in light of the accompanying drawings.

DETAILED DESCRIPTION OF THE INVENTION

Sputter deposition is a convenient way of enhancing surface characteristics of a wide variety of structures. The sputter deposition process involves the vaporization of a coating material from a solid surface known as a target. This material is transported through a low-pressure gaseous environment and deposited as a thin, firmly bonded coating layer onto an adjacent surface, which is called the substrate. Physical vapor deposition uses an electron beam to produce a highly charged plasma containing a combination of metal and gas ions in a vacuum chamber. The electron beam produces a particle flow from a target material. The target material is preferably made of copper and aluminum. The target material may be made of other suitable elements, such as titanium and chromium. The particle flow is transported to a substrate by a vapor. The substrate is preferably a steel, titanium, tungsten carbide, aluminum, copper, or chromed metal. The vapor is preferably a suitable argon gas but may be an inert gas such as helium, neon, krypton, or xenon. The particle flow deposits on the substrate as a coating layer. The coating layer is preferably an even finish, which conforms to the contour of the substrate. The coating layer provides beneficial surface characteristics.

The sputtering process can be done by D.C. sputtering, A.C. sputtering, radio frequency sputtering, magnetron sputtering deposition or other suitable techniques. In a preferred embodiment, a magnetron sputtering deposition technique is employed. Briefly, magnetron sputtering employs magnetic fields to capture secondary electrons emitted from the target. Magnetron sputtering therefore allows for the substrate to be coated at a higher rate compared to some other sputtering techniques.

Figure 1:
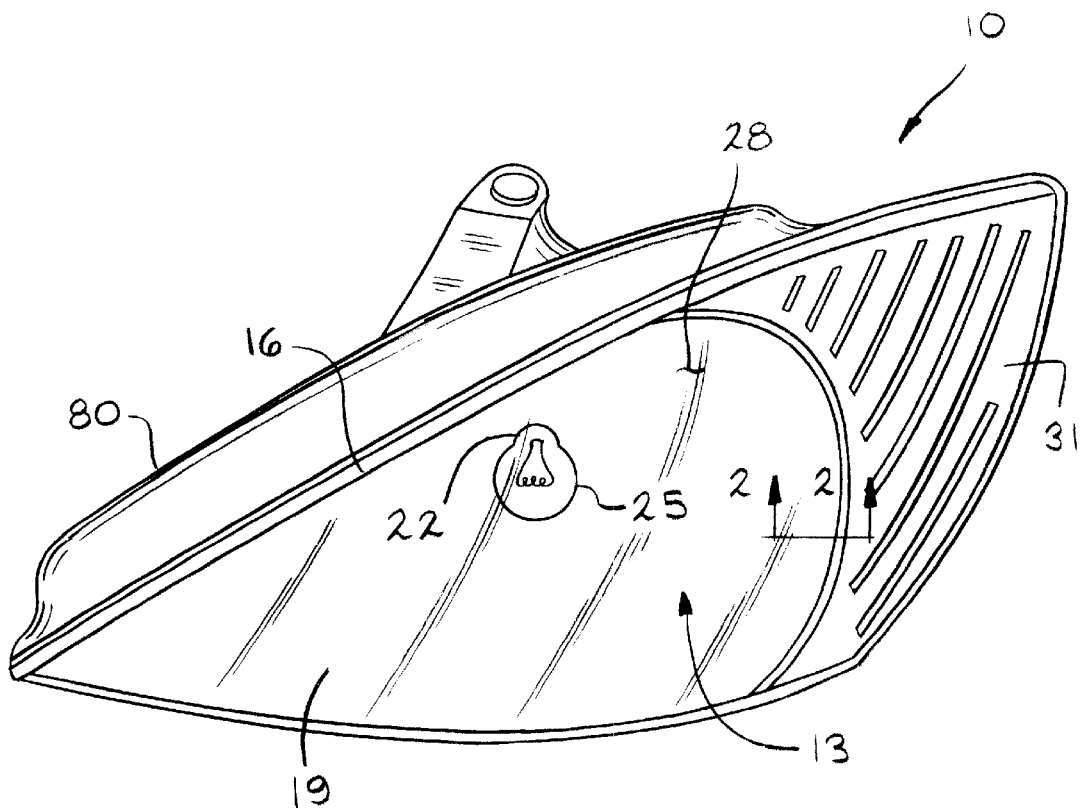
FIG. 1 is a cross-sectional view in elevation of a lamp having a decorative coating according to the invention.

As seen in FIG. 1, an automobile light is illustrated and indicated generally at 10. A reflector 13 of the automobile light typically includes a parabolic portion 16 at a back end of the reflector 13 and a lens 19 at a front end of the reflector 13. The reflector 13 may define a cavity portion 22 for supporting a light source 25, such as a bulb. The light source 25 provides a light beam (not shown). A portion of the light beam from the light source 25 strikes the parabolic portion 16 before exiting the lens 19. A portion of the light beam exits the lens 19 without striking the parabolic portion 16. A coating 28 (best seen in FIG. 2), or film, may be provided to the reflector 13 to condition the light striking the reflector 13. The coating 28 may also be applied to a bezel 31 of the automobile light 10. The reflector 13 and the bezel 31 may include curved regions. The curved regions are included for optimal lighting characteristics as well as to provide an aesthetically pleasing appearance. A housing 80 is useful for supporting the reflector 13, the lens 19, and the bezel 31 and connecting them to an automobile (not shown).

Figure 2:
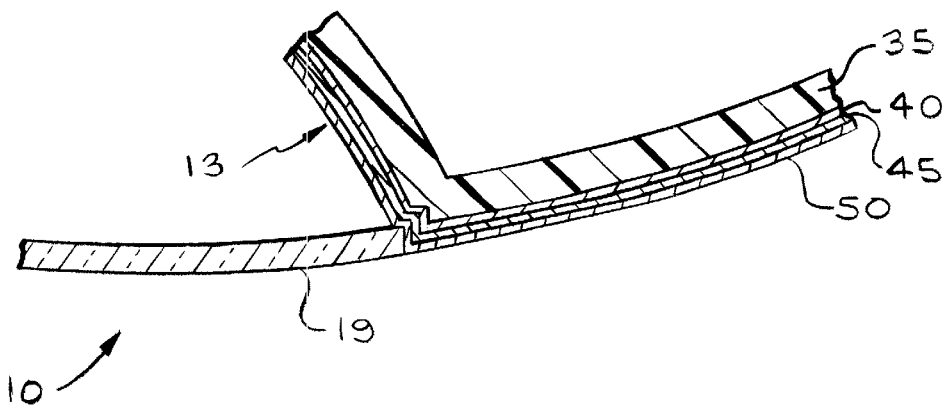
FIG. 2 is a cross-sectional view in elevation of the decorative coating taken along line 2—2 of FIG. 1.

As shown in FIG. 2, the coating 28 preferably includes four layers; a substrate 35, which is preferably covered by a base coat 40, which is preferably covered by a decorative layer 45, which is preferably covered by an outer protective topcoat 50. The coating 28 may be applied to the automobile light 10 by any acceptable manner. In a preferred embodiment, the coating 28 is applied by physical vapor deposition. Physical vapor deposition can be practiced by a wide variety of techniques, such as thermal evaporation, sputtering, chemical vapor deposition, ion plating, electroplating, plasma spraying, and the like. In a preferred embodiment, a magnetron sputtering technique is employed.

The substrate 35 is made of a metallic compound, a plastic compound or any other suitable material. The substrate 35 is preferably a rigid material that can provide structural integrity to one or more components of the automobile light 10, such as the reflector 13 and the bezel 31. The contour of the substrate 35 yields the contour of the automobile light 10 and is therefore preferably configured in a contour which is aesthetically pleasing and complimentary to the location on the automobile at which the automobile light 10 is connected. The substrate 35 is preferably polycarbonate, nylon, ABS (Acrylonitrile-butadiene-styrene copolymer), BMC (Bulk Molding Compound, a polyester based thermoset) or polyetherimide or the like. A commercially available polyetherimide is sold as ULTEM resin by the General Electric Company.

The base coat 40 may be applied to the substrate 35 to prepare the substrate 35 to receive the decorative layer 45. The base coat 40 may be any suitable substance. In a preferred embodiment, the base coat 40 may be an acrylate based coating when the substrate 35 is Bulk Molding Compound. The base coat 40 preferably promotes adhesion of the decorative layer 45 to the substrate 35. The base coat 40 may adhere to the substrate 35. The base coat 40 may be applied to the substrate 35 in any acceptable manner. The lens 19 may be fixed to any suitable portion of the automobile light 10 in any suitable manner.

Figure 3:
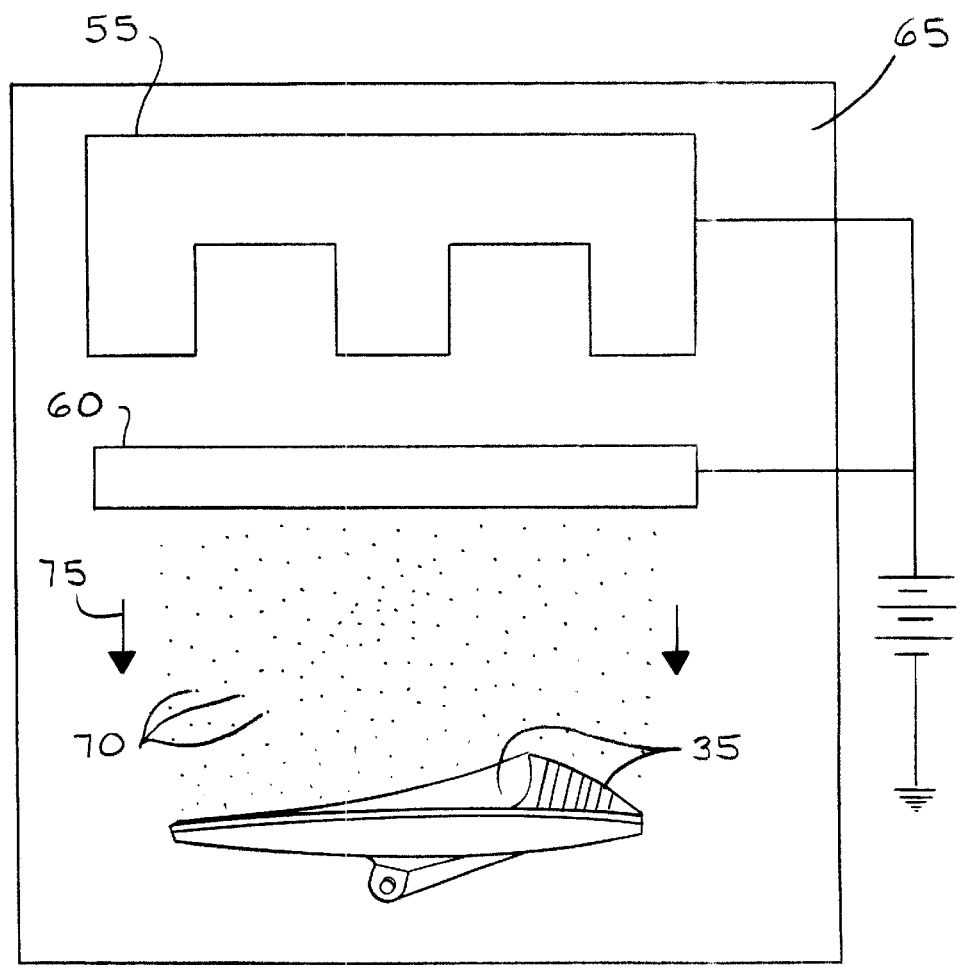
FIG. 3 is a simplified view of magnetron sputtering to produce the decorative coating of FIG. 1.

Referring now to FIG. 3, the decorative layer 45 is applied to the substrate 35 by a sputtering technique, preferably a magnetron sputtering technique. The decorative layer 45 may be applied by a vapor deposition technique, thereby producing a vapor deposition decorative layer. The decorative layer 45 may be applied by a sputtering technique, thereby producing a sputtered decorative layer. The decorative layer 45 may be applied by a magnetron sputtering technique, thereby producing a magnetron sputtered decorative layer. When a base coat 40 is applied to the substrate 35, the decorative layer 45 may adhere to all or part of the base coat 40 which adheres to the substrate 35.

The decorative layer 45 is preferably a copper-aluminum alloy layer. In a preferred embodiment, the decorative layer 45 has copper in an amount of within the range of from about 85 percent to about 95 percent and the balance being aluminum. The decorative layer 45 has copper in an amount of about 90 percent and about 10 percent aluminum. Deposits of the decorative layer 45 with other substances, such as, for example, chromium, nickel, platinum, palladium, cobalt, silver, tungsten, gold, or even alloys of two or more of these metals could also be employed. The decorative layer 45 may also be a copper-silver alloy layer. In a preferred embodiment, the decorative layer 45 has copper in an amount of within the range of from about 85 percent to about 95 percent and the balance being silver. The decorative layer 45 has copper in an amount of about 90 percent and about 10 percent silver.

The decorative layer 45 has a golden appearance. As used herein, the term "golden" is taken to include those appearances such as gold, yellow gold as used in the jewelry industry, bronze or brass appearances. Likewise the term "golden" is taken to exclude white gold as used in the jewelry industry or silver appearances.

The topcoat 50 is applied to the decorative layer 45. More than one layer of topcoat 50 may be applied to the decorative layer 45. Should a portion of the substrate 35, or the base coat 40 be uncovered by the decorative layer 45, the topcoat 50 is applied directly to the substrate 35, or the base coat 40. In a preferred embodiment, the topcoat 50 is hexamethydisiloxane, or a similar compound. The topcoat 50 serves to protect the decorative layer 45 from environmental decomposition from chemicals such as sodium chloride. It should be noted that, when the decorative layer 45 is a copper-aluminum layer, the layer of hexamethydisiloxane to be applied is preferably about twice as thick as the layer of hexamethydisiloxane that would be needed if the decorative layer was aluminum. The topcoat 50 may also be a lacquer compound or a similar compound.

As shown in FIG. 3, a magnetron sputtering technique may be employed to provide the decorative layer 45 to the substrate 35 of the automobile light 10. The preferred technique includes a suitable magnetic yoke 55 proximate a suitable target 60. The target 60 is preferably a copper-aluminum alloy that is about 90 percent copper and about 10 percent aluminum. The target 60 may also be a copper-silver alloy, the copper percentage of the alloy being within the range of from about 10 percent copper to about 90 percent copper.

The magnetic yoke 55 and the target 60 are preferably provided with a suitable supply of alternating current. In a preferred embodiment, the alternating current is supplied within the range of from about 600 volts to about 1000 volts.

The magnetic yoke 55 and the target 60 are preferably provided within a suitable vacuum chamber 65. The vacuum chamber 65 preferably provides an inert atmosphere for the magnetron sputtering process. An inert gas, such as argon, helium, neon, krypton, or xenon, is provided in the vacuum chamber 65 within the range of from about 1 mTorr to about 10 mTorr for optimal operating pressure. The substrate 35 is preferably also provided in the vacuum chamber 65. As the alternating current is supplied to the target 60, the target 60 produces a flow of molecules 70. The molecules 70 travel toward the substrate 35 in the direction shown by arrow 75. It should be understood that the substrate 35 may have been previously treated or coated by the base coat 40, as described above. When the molecules 70 contact the substrate 35 or the base coat 40, the molecules 70 adhere thereto.

The principle and mode of operation of this invention have been described in its preferred embodiments. However, it should be noted that this invention may be practiced otherwise than as specifically illustrated and described without departing from its scope.

What is claimed is:

1. An automobile light having a coating comprising:
   a reflector; and
   a bezel connected to the reflector;
   wherein the coating is formed of a plurality of layers including a base coating layer, a decorative coating layer, and a topcoat layer wherein the coating is applied to one or both of the reflector and the bezel;
   wherein the decorative coating layer has a golden appearance; and
   wherein the decorative coating layer has copper in an amount of within the range of from about 85 percent to about 95 percent and the balance is aluminum.

2. The automobile light of claim 1 wherein the decorative layer is a vapor deposition decorative layer.

3. The automobile light of claim 2 wherein the decorative layer is a sputtered decorative layer.

4. The automobile light of claim 3 wherein the sputtered decorative layer is a magnetron sputtered decorative layer.

5. The automobile light of claim 1 wherein the decorative layer is a copper-aluminum alloy having a golden appearance.

6. The automobile light of claim 1 wherein the decorative layer has copper in an amount of about 90 percent.

7. The automobile light of claim 1 wherein the decorative layer has copper in an amount of about 90 percent and the balance being aluminum.

8. The automobile light of claim 1 wherein the decorative layer has copper in an amount of about 90 percent and the balance being silver.

9. An automobile light having a coating comprising:

a reflector; and a bezel connected to the reflector;

the coating being formed of a plurality of layers including a base coating layer, a decorative coating layer, and a topcoat layer wherein the coating is applied to one or both of the reflector and the bezel and wherein the decorative coating layer is a magnetron sputtered decorative coating layer having copper in an amount of about 90 percent.

10. An automobile light having a coating comprising:

a reflector; and a bezel connected to the reflector;

wherein the coating is formed of a plurality of layers including a base coating layer, a decorative coating layer, and a topcoat layer wherein the coating is applied to one or both of the reflector and the bezel;

wherein the decorative coating layer has a golden appearance; and wherein the decorative coating layer has copper in an amount of within the range of from about 85 percent to about 95 percent and the balance is silver.

11. The automobile light of claim 10 wherein the decorative layer is a vapor deposition decorative layer.

12. The automobile light of claim 11 wherein the decorative layer is a sputtered decorative layer.

13. The automobile light of claim 12 wherein the sputtered decorative layer is a magnetron sputtered decorative layer.

14. The automobile light of claim 10 wherein the decorative layer is a copper-silver alloy having a golden appearance.

15. The automobile light of claim 10 wherein the decorative layer has copper in an amount of about 90 percent.

16. The automobile light of claim 10 wherein the decorative layer has copper in an amount of about 90 percent and the balance is silver.

* * * * *